(12) United States Patent
Yamada et al.

(10) Patent No.: US 11,984,053 B2
(45) Date of Patent: May 14, 2024

(54) DISPLAY DEVICE AND METHOD OF DRIVING DISPLAY DEVICE

(71) Applicant: SHARP KABUSHIKI KAISHA, Osaka (JP)

(72) Inventors: Hirohisa Yamada, Osaka (JP); Keisuke Kitano, Osaka (JP); Yusuke Sakakibara, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/915,079

(22) PCT Filed: Apr. 8, 2020

(86) PCT No.: PCT/JP2020/015807
§ 371 (c)(1),
(2) Date: Sep. 27, 2022

(87) PCT Pub. No.: WO2021/205564
PCT Pub. Date: Oct. 14, 2021

(65) Prior Publication Data
US 2023/0186804 A1 Jun. 15, 2023

(51) Int. Cl.
 G09G 3/00 (2006.01)
 G01R 31/26 (2020.01)
 G09G 3/32 (2016.01)
 H10K 59/12 (2023.01)

(52) U.S. Cl.
CPC ......... *G09G 3/006* (2013.01); *G01R 31/2635* (2013.01); *G09G 3/32* (2013.01); *G09G 2330/10* (2013.01); *G09G 2330/12* (2013.01); *H10K 59/12* (2023.02)

(58) Field of Classification Search
CPC ........ G09G 3/006; G09G 3/32; G09G 3/3208; G09G 2330/12; H10K 59/12
See application file for complete search history.

(56) References Cited

U.S. PATENT DOCUMENTS

| | | | |
|---|---|---|---|
| 2007/0139317 A1* | 6/2007 | Martel | H05B 45/3725 345/82 |
| 2008/0252571 A1* | 10/2008 | Hente | G09G 3/3208 345/76 |
| 2011/0191042 A1 | 8/2011 | Chaji et al. | |
| 2014/0015824 A1 | 1/2014 | Chaji et al. | |

(Continued)

FOREIGN PATENT DOCUMENTS

| | | |
|---|---|---|
| JP | 2006266750 A | 10/2006 |
| JP | 2013519113 A | 5/2013 |

*Primary Examiner* — Yuzhen Shen
(74) *Attorney, Agent, or Firm* — ScienBiziP, P.C.

(57) ABSTRACT

An inspection circuit in a display device includes: a measuring circuit configured to sweep a voltage to the display device and to measure a current value that flows in a light-emitting element in response to a voltage value applied; a computation circuit configured to compute a first derivative value of the current value with respect to the voltage value, the first derivative value representing voltage dependence of a first derivative of the current value; a peak determination circuit configured to determine a peak of the first derivative value; and a processing circuit configured to process the light-emitting element based on a result of the determination by the peak determination circuit.

9 Claims, 8 Drawing Sheets

(56) References Cited

U.S. PATENT DOCUMENTS

| | | |
|---|---|---|
| 2014/0292342 A1 | 10/2014 | Chaji |
| 2014/0306868 A1 | 10/2014 | Chaji |
| 2014/0313111 A1 | 10/2014 | Chaji et al. |
| 2015/0103106 A1 | 4/2015 | Chaji et al. |
| 2016/0307498 A1 | 10/2016 | Chaji |
| 2016/0372029 A1* | 12/2016 | Park .................... G09G 3/3233 |
| 2017/0011674 A1 | 1/2017 | Chaji et al. |
| 2017/0365201 A1 | 12/2017 | Chaji et al. |
| 2018/0137795 A1 | 5/2018 | Chaji |
| 2018/0158402 A1 | 6/2018 | Chaji et al. |
| 2018/0308405 A1 | 10/2018 | Chaji et al. |
| 2018/0366060 A1 | 12/2018 | Chaji et al. |
| 2019/0088211 A1 | 3/2019 | Chaji |
| 2019/0096301 A1 | 3/2019 | Chaji |
| 2019/0333430 A1 | 10/2019 | Chaji et al. |
| 2022/0130329 A1 | 4/2022 | Chaji et al. |

* cited by examiner

| SUBPIXEL | RESULT OF DETERMINATION IN S14 | DATA SIGNAL |
|---|---|---|
| R | NON-LIGHT-EMITTING ELEMENT | 0 |
| G | LIGHT-EMISSION-CAPABLE ELEMENT | 3 |
| B | LIGHT-EMISSION-CAPABLE ELEMENT | 4 |

| SUBPIXEL | RESULT OF DETERMINATION IN S14 | DATA SIGNAL |
|---|---|---|
| R | NON-LIGHT-EMITTING ELEMENT | 0 |
| G | LIGHT-EMISSION-CAPABLE ELEMENT | 0 |
| B | LIGHT-EMISSION-CAPABLE ELEMENT | 0 |

| SUBPIXEL | RESULT OF S23 | DATA SIGNAL |
|---|---|---|
| R | ABNORMAL LIGHT-EMITTING ELEMENT | 0 |
| G | NORMAL LIGHT-EMITTING ELEMENT | 3 |
| B | NORMAL LIGHT-EMITTING ELEMENT | 4 |

| SUBPIXEL | RESULT OF S23 | DATA SIGNAL |
|---|---|---|
| R | ABNORMAL LIGHT-EMITTING ELEMENT | 0 |
| G | NORMAL LIGHT-EMITTING ELEMENT | 0 |
| B | NORMAL LIGHT-EMITTING ELEMENT | 0 |

DISPLAY DEVICE AND METHOD OF DRIVING DISPLAY DEVICE

TECHNICAL FIELD

The present invention relates to display devices including light-emitting elements and to methods of driving such display devices.

BACKGROUND ART

Display devices including pixels are inspected with all pixels being turned on and supplied with suitable electric power, before being shipped out. Then, the light-emitting elements in the display device are optically inspected to find whether or not all the light-emitting elements are operating normally. It is particularly important to check whether there are any luminance irregularities among the light-emitting elements and additionally whether there are any defective pixels that can develop from, for example, dark spots or Wight spots.

Defective pixels are typically detected by relative luminance measurement on the light-emitting elements under a CCD (charge coupled device) camera before the display device is shipped (Patent Literature 1).

Technology is disclosed that, even after the display device is shipped, enables addressing decays of light-emitting elements in the display device by using an optical sensor provided in a display unit (Patent Literature 2).

CITATION LIST

Patent Literature

Patent Literature 1: Japanese Unexamined Patent Application Publication, Tokukai, No. 2006-266750 (Publication Date: Oct. 5, 2006)

Patent Literature 2: Published Japanese Translation of PCT Application, Tokuhyo, No. 2013-519113 (Publication Date: May 23, 2013)

SUMMARY

Technical Problem

The use of a display device after shipping thereof causes changes in the condition of the light-emitting elements in the display device, which makes it necessary to perform a proper process.

However, the optical inspection described in Patent Literature 1 requires a CCD camera or like device. It is therefore not practical to use this technology to inspect the light-emitting elements for changes therein after the shipping of the display device.

Meanwhile, Patent Literature 2 discloses a method of inspecting the luminance condition of the light-emitting elements by using a plurality of optical sensors provided in the display device. However, the provision of the optical sensors in the display device disadvantageously adds to manufacturing cost.

Solution to Problem

To address these problems, the disclosure, in one aspect thereof, is directed to a display device including a plurality of pixels each including at least one light-emitting element, the display device including an inspection circuit configured to inspect a luminance condition of the at least one light-emitting element, the inspection circuit including: a voltage sweep circuit configured to sweep a voltage to the at least one light-emitting element; a measuring circuit configured to sweep a voltage to the at least one light-emitting element and to measure a current value that flows in the at least one light-emitting element in response to a voltage value applied; a computation circuit configured to compute a first derivative value of the current value with respect to the voltage value, the first derivative value representing voltage dependence of a first derivative of the current value; a peak determination circuit configured to determine a peak of the first derivative value; and a processing circuit configured to process the at least one light-emitting element based on a result of the determination by the peak determination circuit.

To address the problems, the disclosure, in one aspect thereof, is directed to a method of driving a display device, the method including the inspection step of inspecting a luminance condition of a light-emitting element, the inspection step including: the measurement step of sweeping a voltage to the light-emitting element and measuring a current value that flows in the light-emitting element in response to a voltage value applied; the computation step of computing a first derivative value of the current value with respect to the voltage value, the first derivative value representing voltage dependence of a first derivative of the current value; the peak determination step of determining a peak of the first derivative value; and the processing step of processing the light-emitting element based on a result of the peak determination step.

Advantageous Effects of disclosure

The disclosure, in an aspect thereof, enables properly processing changes caused in the luminance condition of the light-emitting elements in the display device due to the use of the display device after shipping thereof, thereby enabling maintaining the quality of the light-emitting elements in the display device.

DESCRIPTION OF EMBODIMENTS

Embodiment 1

Figure 1:
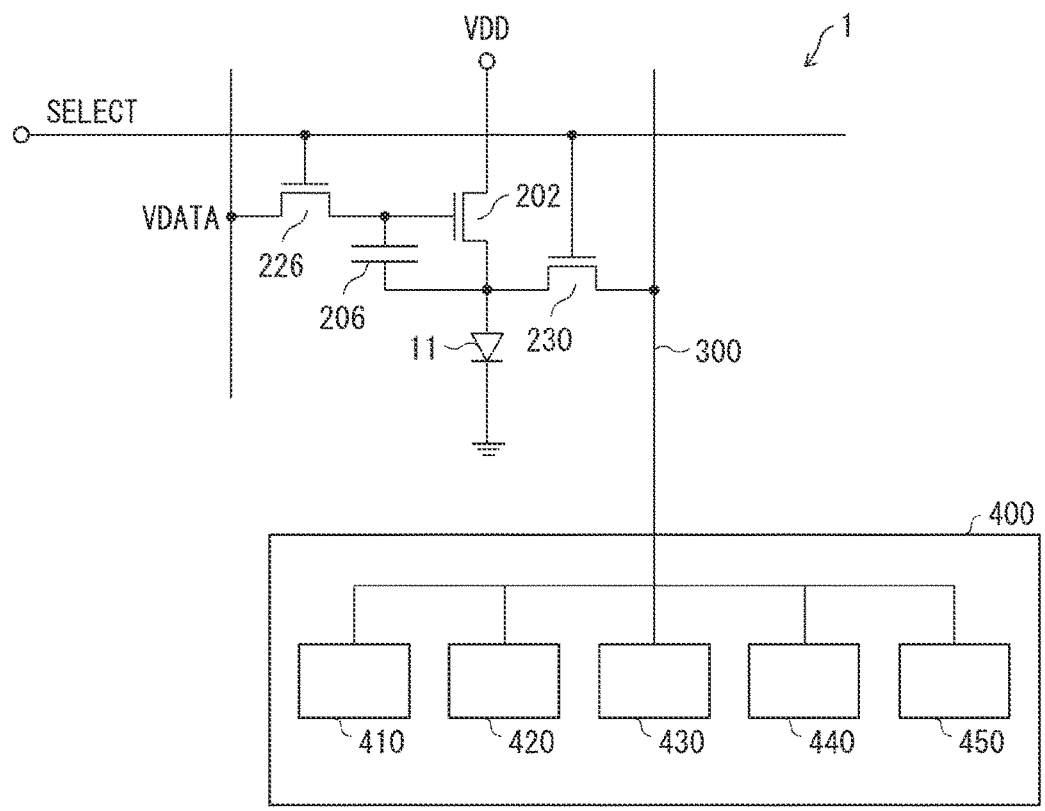
FIG. 1 is a diagram representing a drive circuit in a display device in accordance with Embodiment 1.

FIG. 1 is a diagram representing a drive circuit in a display device 1. A description of a light-emitting element 11 will be given later. The drive circuit for the light-emitting element 11 in a QLED (quantum-dot light-emitting diode) includes a drive transistor 202, a switching transistor 226, a monitoring transistor 230, a capacitor 206, and a monitoring line 300.

The display device 1 includes an inspection circuit 400 for inspecting the luminance condition of the light-emitting element 11 connected to the monitoring line 300. The inspection circuit 400 inspects the luminance condition of the light-emitting element 11. Note that the luminance condition refers to the light-emitting condition and the non-light-emitting condition of the light-emitting element 11.

The inspection circuit 400 includes: a voltage supply circuit 410 (voltage sweep circuit) for supplying voltage for inspection of the light-emitting element 11; a measuring circuit 420 for measuring the current that flows in the light-emitting element 11; a computation circuit 430 for computing a first derivative value of the current value with respect to the voltage value, which represents the voltage dependence of the first derivative of the current value; a memory section (not shown) for storing results of computation; a peak determination circuit 440 for determining a peak of the first derivative value; and a processing circuit 450 for processing the light-emitting element 11 on the basis of a result of the determination by the peak determination circuit 440.

The inspection circuit 400 may be provided outside the display device 1 or in a frame area surrounding a display area of the display device 1 including the light-emitting element 11. In addition, one inspection circuit 400 may be provided for each light-emitting element 11 or commonly to a plurality of light-emitting elements 11.

Figure 2:
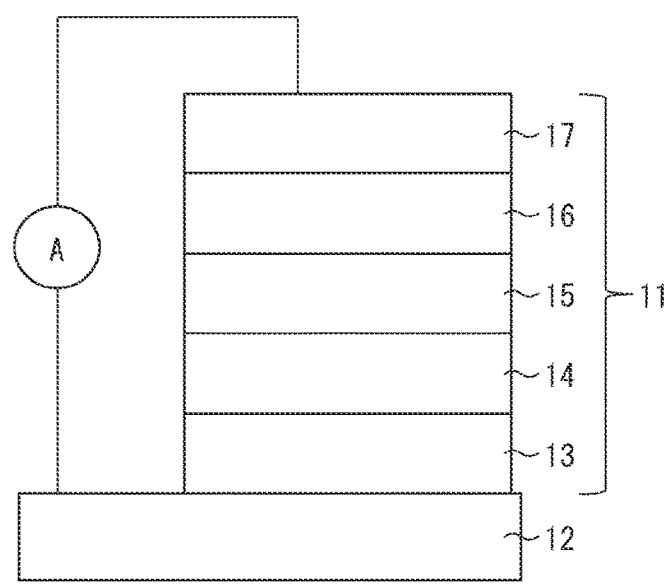
FIG. 2 is a cross-sectional view of a light-emitting element in the display device.

FIG. 2 is a cross-sectional view of the light-emitting element 11 in the display device 1 in accordance with Embodiment 1. The display device 1 includes the light-emitting element 11. The light-emitting element 11 has a structure including a stack of layers of the light-emitting element 11 on an array substrate 12 in which thin film transistors (TFTs, not shown) are formed. The light-emitting element 11 includes an anode 13, a hole transport layer (HTL) 14, a light-emitting layer 15, an electron transport layer (ETL) 16, and a cathode 17, all of which are provided on the array substrate 12 in this order when viewed from below. The anode 13 formed on the array substrate 12 is electrically connected to a thin film transistor in the array substrate 12. The anode 13 and the cathode 17 contain a conductive material and are electrically connected respectively to the hole transport layer 14 and the electron transport layer 16. The anode 13 and the cathode 17 may be transposed in the present embodiment.

Either one of the anode 13 and the cathode 17 is a transparent electrode. The transparent electrode may be made of, for example, no, IZO, ZnO, AZO, BZO, or FTO by, for example, sputtering. The anode 13 or the cathode 17 may contain a metal material. The metal material is preferably a single metal such as Al, Cu, u, Ag, or Mg, all of which have a high reflectance to visible light, or an alloy of any of these metals.

The hole transport layer 14 is not limited in any particular manner so long as the hole transport layer 14 contains a hole transport material capable of stably transporting holes to the light-emitting layer 15. In particular, the hole transport material preferably has a high hole mobility. Additionally, the hole transport material is preferably an electron-blocking material capable of preventing the electrons coming from the cathode 17 from passing through because this can increase the hole-electron recombination efficiency in the light-emitting layer 15.

The hole transport layer 14 is made of, for example, an arylamine derivative, an anthracene derivative, a carbazole derivative, a thiophene derivative, a fluorene derivative, a distyryl benzene derivative, or a Spiro compound. Note that the hole transport layer 14 is more preferably made of polyvinyl carbazole (PVK) or poly[(9,9-dioctylfluorenyl-2,7-diyl)-co-(4,4'-(N-(4-sec-butylphenyl))diphenylamine)] (TFB). Because PVK and TFB improve the efficiency of light emission caused by the recombination of electrons and holes in the light-emitting layer 15 containing quantum dots, PVK and TFB advantageously improve the luminescence properties of electroluminescence elements.

In addition, there may be provided a hole injection layer (not shown) between the anode 13 and the hole transport layer 14. This hole injection layer may be made of any hole injecting material so long as the hole injecting material is capable of stably inject holes to the light-emitting layer 15. The hole injecting material may be, for example, an arylamine derivative, a porphyrin derivative, a phthalocyanine derivative, a carbazole derivative, additionally, a conductive polymer such as a polyaniline derivative, a polythiophene derivative, or a polyphenylene vinylene derivative.

Figure 3:
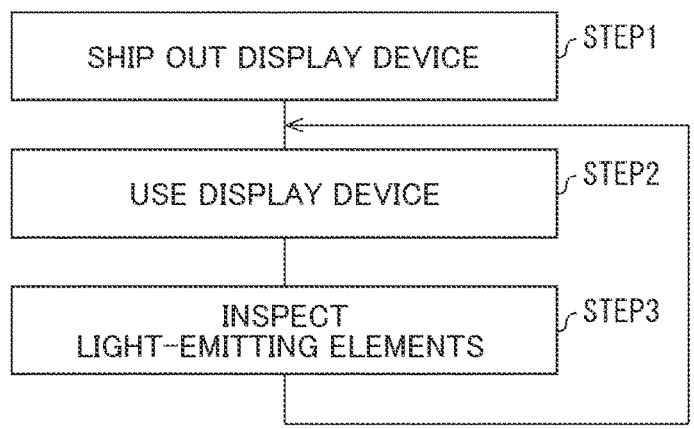
FIG. 3 is a flow chart representing a method of inspecting (method of driving) the light-emitting element.

FIG. 3 is a flow chart representing a method of inspecting (method of driving) the light-emitting element 11 provided in the display device 1. After a light-on inspection is performed on the display device 1 before shipping, the display device 1 is shipped (STEP 1). Then, the light-emitting element 11 in the display device 1 shipped is used by a user (STEP 2).

Next, an inspection process is performed whereby the luminance condition of the light-emitting element 11 used is inspected (STEP 3). Thereafter, the method returns to STEP 2.

Figure 4:
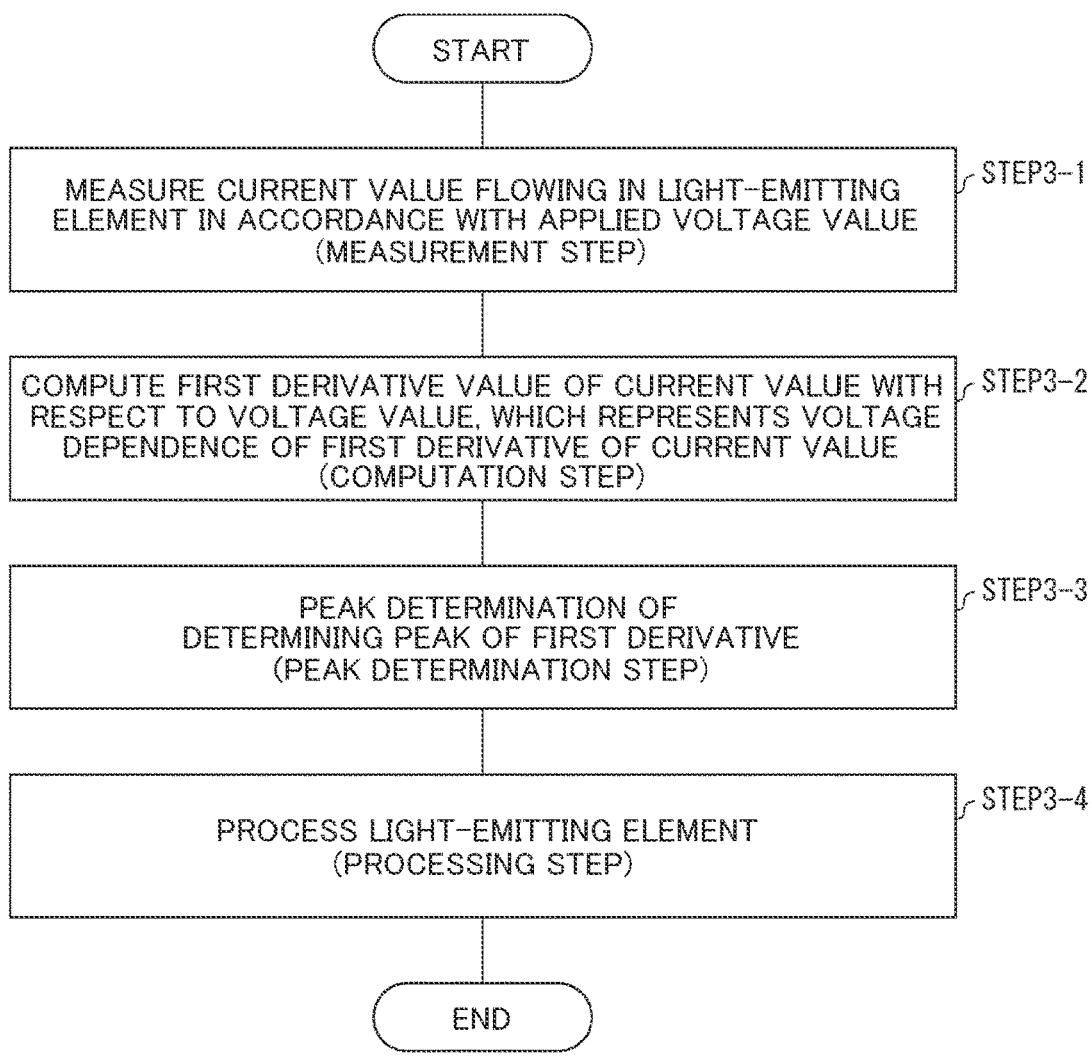
FIG. 4 is a flow chart representing a method of inspecting the light-emitting element.

FIG. 4 is a flow chart representing a method of inspecting the light-emitting element 11 in the display device 1. In this inspection, the luminance condition of the light-emitting element 11 is inspected. The condition of the light-emitting element 11 such as the turn-on state and dark spot are inspected. The inspection process in FIG. 3 (STEP 3) includes the following steps.

The voltage supply circuit 410 in the inspection circuit 400 sweeps a voltage greater than or equal to a prescribed value that is determined in advance to the light-emitting element 11. This prescribed voltage at least needs only to be equal to the voltage value acquired in advance at which the light-emitting element 11 starts emitting light. The measuring circuit 420 measures a current value that flows in the light-emitting element 11 in response to a voltage value further applied by the voltage supply circuit 410 (STEP 3-1, (measurement step)).

If the measured current value is not zero, the computation circuit 430 in the inspection circuit 400 computes a first derivative value of the current value with respect to the voltage value, which represents the voltage dependence of the first derivative of the current value (STEP 3-2, (computation step)). Then, the peak determination circuit 440 in the inspection circuit 400 determines the presence/absence of a local maximum value in the voltage dependence of the first derivative of the current value, that is, computes a voltage value at which the first derivative value dI/dV with respect to voltage has a peak (local maximum value) and determines the presence/absence of a peak voltage value (STEP 3-3, (peak determination step)). The processing circuit 450 in the inspection circuit 400 processes the light-emitting element 11 on the basis of the determination (STEP 3-4, (processing step)). This process will be specifically described later. Here, the peak voltage value of the first derivative value dI/dV with respect to voltage refers to a voltage value at which the first derivative value dI/dV with respect to voltage has a peak (local maximum value).

Figure 5:
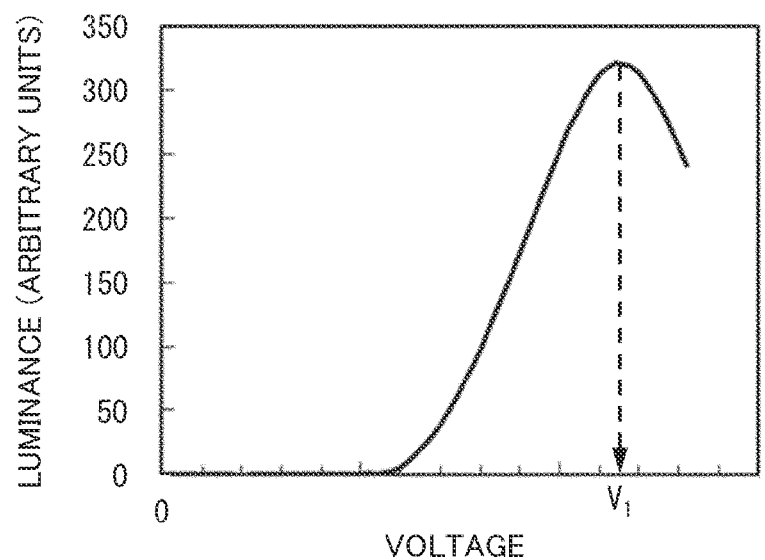
FIG. 5 is a graph representing a relationship between the voltage applied to the light-emitting element and the luminance of the light-emitting element
Figure 6:
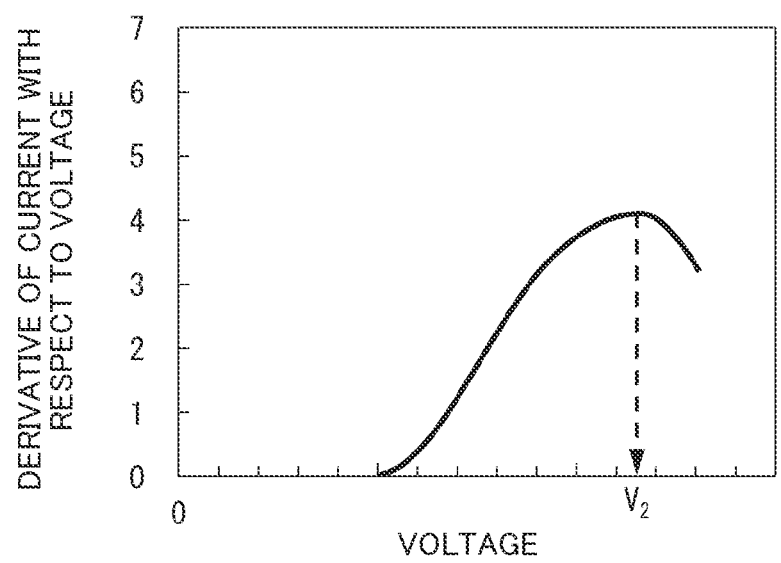
FIG. 6 is a graph representing a relationship between the voltage applied to the light-emitting element and the derivative of a current with respect to the voltage.

FIG. 5 is a graph representing a relationship between the voltage applied to the light-emitting element 11 and the luminance of the light-emitting element 11. FIG. 6 is a graph representing a relationship between the voltage applied to the light-emitting element 11 and the derivative of a current that flows in the light-emitting element 11 with respect to a voltage.

The inventors of the disclosure have found the fact that the peak voltage value $V_1$ at which the luminance of the light-emitting element 11 has a peak when a voltage that is applied to the light-emitting element 11 is swept matches the voltage value $V_2$ at a changing point of the derivative of a current that flows in the light-emitting element 11 with respect to a voltage, as shown in FIGS. 5 and 6. The inspection of the light-emitting element 11 in accordance with the present embodiment has a basis in this fact found by the inventors of the disclosure.

The voltage supply circuit 410 in the inspection circuit 400 applies voltage to the light-emitting element 11 While altering the voltage value. Then, the measuring circuit 420 measures the current that flows in the light-emitting element 11 at that time and transmits the measured current value to the computation circuit 430. Next, the computation circuit 430 computes the first derivative value dI/dV of a current value with respect to a voltage value.

The present embodiment provides the display device 1 that: calculates the first derivative value dI/dV of current with respect to voltage from the results of the measurement by the measuring circuit 420; performs a test to calculate a voltage at which the first derivative value dI/dV with respect to voltage has a peak; inspects the luminance condition of the light-emitting element 11 in the display device 1; and processes in accordance with the luminance condition thereof.

Figure 7:
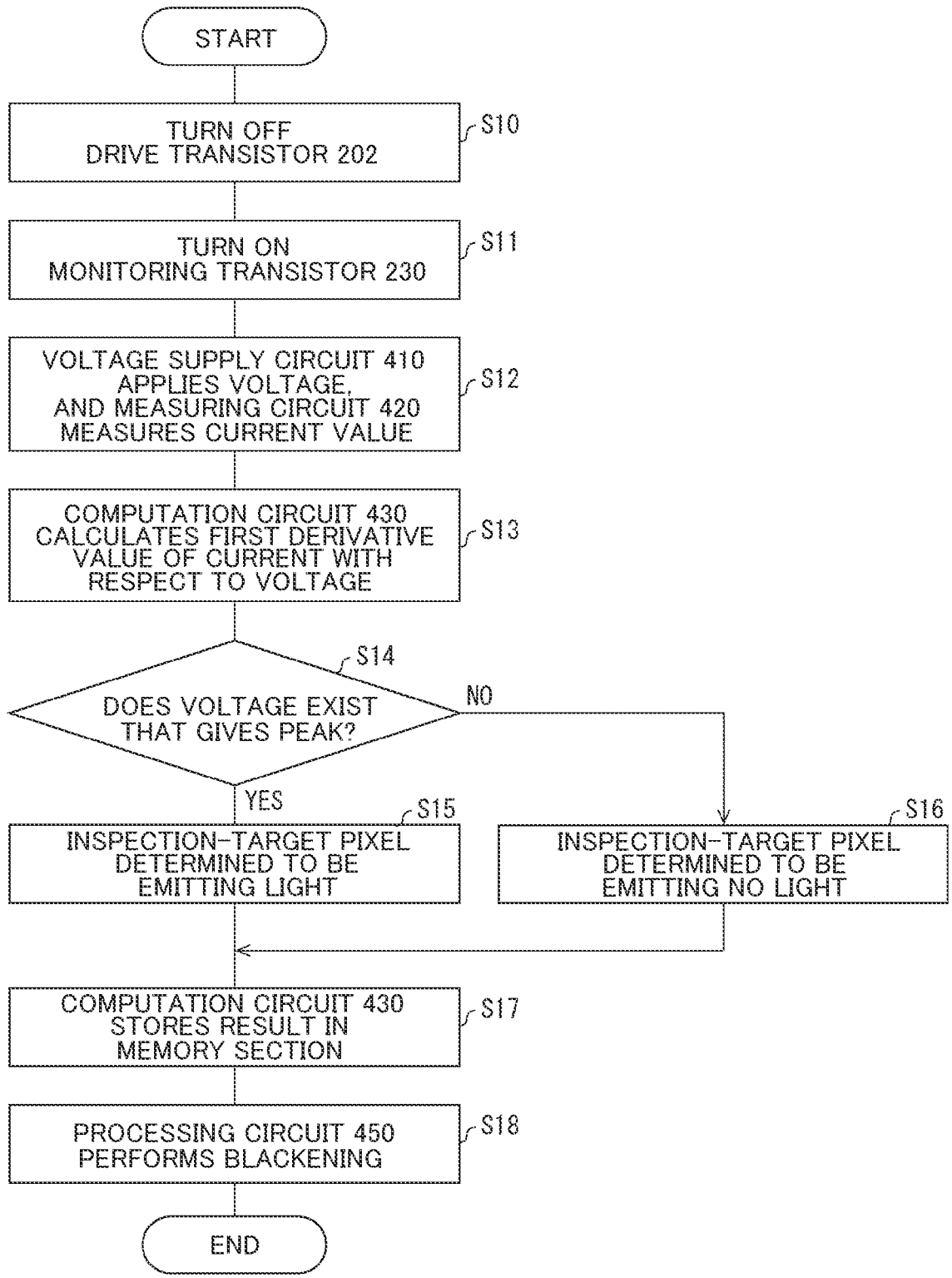
FIG. 7 is a flow chart representing an inspection process for the light-emitting element.

FIG. 7 is a flow chart representing an inspection process for the light-emitting element 11. The inspection step (STEP 3) in the flow chart representing the method of inspecting the light-emitting element 11 in the display device 1 shown in FIG. 3 is shown in further detail in FIG. 7.

A description is given next of a basic operation of an embodiment of the disclosure. First, the drive transistor 202 is turned off (step S10). Then, the monitoring transistor 230 is turned on (step S11). Next, the voltage supply circuit 410 applies voltage to the light-emitting element 11 while altering the voltage value. This applied voltage needs only to be in a voltage range from the voltage acquired in advance at which the light-emitting element 11 starts emitting light to a voltage at which a peak voltage can be recognized. This configuration enables a light-on inspection in a voltage range where the light-emitting element 11 stably emits light. Then, the measuring circuit 420 measures the current that flows in the light-emitting element 11 at that time and transmits the measured current value to the computation circuit 430 as necessary (step S12). The process so far is an equivalent of the measurement step (STEP 3-1) in FIG. 4.

Thereafter, the computation circuit 430 calculates a first derivative value of the measured current value with respect to voltage (step S13). This is an equivalent of the computation step (STEP 3-2) in FIG. 4 whereby the first derivative value of the current value with respect to the voltage value, which represents the voltage dependence of the first derivative of the current value, is computed. Then, the peak determination circuit 440 determines the presence/absence of a voltage value at which the first derivative value of current with respect to voltage has a peak (step S14). This is an equivalent of the peak determination step (STEP 3-3) in FIG. 4 whereby the peak voltage value of the peak of the first derivative value is determined.

If the peak determination circuit 440 determines that there exists a voltage value at which the first derivative value with respect to voltage has a peak (YES in step S14), the computation circuit 430 evaluates that the light-emitting element 11 in the subpixel that is an inspection target is emitting light (light-emission-capable element) (S15) and records the result of the inspection in a memory section (S17). If the computation circuit 430 determines that there exists no voltage value at which the first derivative value with respect to voltage has a peak (NO in step S14), the computation circuit 430 evaluates that the light-emitting element 11 in the subpixel that is an inspection target is not emitting light (non-light-emitting element) (S16), and the peak determination circuit 440 records the result of the inspection in the memory section (S17).

The processing circuit 450 performs the following process (S18) on the light-emitting element determined to be a non-light-emitting element in (S14) and the pixel including that light-emitting element by making use of the result of the inspection of (S17). This is an equivalent of the processing step (STEP 3-4) for the light-emitting element in FIG. 4. If there is a non-light-emitting element in a pixel, the pixel loses the color balance. This disadvantageously lowers quality. The processing circuit 450 performs a blackening process of assigning a data signal (zero data signal) that inherently represents a black display to a pixel including such a non-light-emitting element.

Blackening is to assign a data signal (zero data signal) that inherently represents a black display to a pixel including such a non-light-emitting element.

Figures 8, 9, 10:
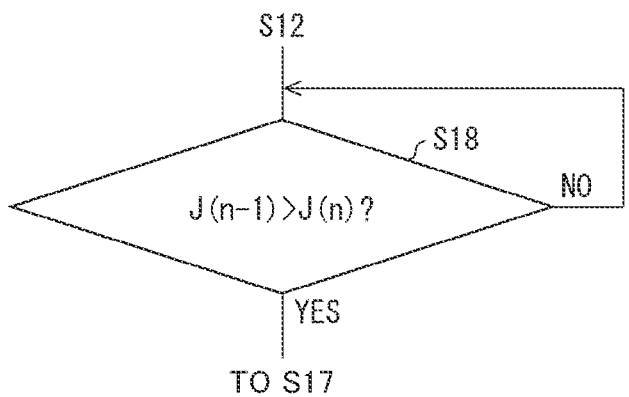
FIG. 8 is a diagram showing a method of blackening in a blackening step for a light-on inspection method for the light-emitting element.
FIG. 9 is a diagram showing a method of blackening in a blackening step for a light-on inspection method for the light-emitting element.
FIG. 10 is a diagram showing details of the flow chart.

FIGS. 8 and 9 are diagrams showing a method of blackening in a blackening step for a light-on inspection method for the light-emitting element 11. In the example shown in FIG. 8, as shown in FIG. 9, an example is shown where if there is a light-emitting element 11 for red light (R) determined to be a non-light-emitting element, a zero data signal is inputted to the light-emitting elements 11 for green (G) and blue (B), which are the other colors. This enables maintaining quality in a satisfactory manner.

In this manner, the peak determination circuit 440 calculates the first derivative value of current with respect to voltage and determines the presence/absence of a peak voltage value, and if a peak voltage value is determined to exist, the peak determination circuit 440 evaluates that the light-emitting element 11 is emitting light (light-emission-capable element). If a peak voltage value is determined to not exist, the peak determination circuit 440 evaluates that the light-emitting element 11 is not emitting light (non-light-emitting element). The computation circuit 430 stores this result in the memory section. This enables inspection for each light-emitting element 11 in the QLED.

According to this configuration, the inspection can be performed for each light-emitting element 11 in the QLED independently of the pixel size of the display device, by using the first derivative value of the measured current value with respect to voltage.

This enables properly processing changes caused in the light-emitting element in the display device due to the use of the display device after shipping thereof.

The disclosure, in an aspect thereof, enables, for example, light-on inspection, dark-spot inspection, and bright-spot inspection of light-emitting elements in downsized pixels at a low cost.

FIG. 10 is a diagram showing details of the flow chart. In this example, details of step S12 to step S14 in FIG. 7 will be described.

The voltage supply circuit 410 alters the voltage value applied to the light-emitting element 11 while continuously increasing the voltage by a voltage interval of $\Delta V$. This voltage interval $\Delta V$ needs only to be an interval from a voltage acquired in advance at which the light-emitting element 11 starts emitting light to a voltage at which a peak voltage can be recognized. For instance, letting Vn be the initial value of the voltage, and In be the current value to be measured by the measuring circuit 420 at that time, the computation circuit 430 computes $\Delta In-I(n-1)/\Delta V$ and designates the result of this computation as J(n) (where n is an integer). In other words, the J value of the result of the computation by the (n−1)-th voltage application is denoted by J(n−1). In addition, for convenience, n in the first measurement of voltage application is set to 1 (n=1). In the voltage application performed immediately after that, n is set to 2 (n=2).

Next, the computation circuit 430 compares the magnitude of the J value and the magnitude of the immediately preceding J value. In other words, the determination formula, "J(n−1)>J(n)," is evaluated (step S18), and if this condition does not hold, n is incremented (i.e., the applied voltage is increased), and another decay inspection is performed. Additionally, if the determination formula, "J(n−1)>J(n)," holds, the voltage value is determined to give a peak in the voltage dependence of the first derivative value of a current value with respect to voltage.

Figure 11:
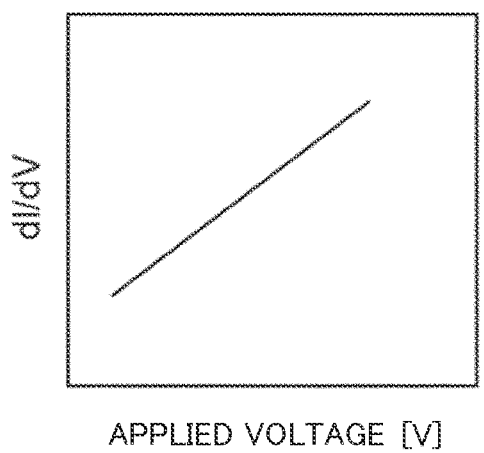
FIG. 11 is a graph representing a relationship between the voltage applied to the light-emitting element and the derivative of a supplied current with respect to the applied voltage.
Figure 12:
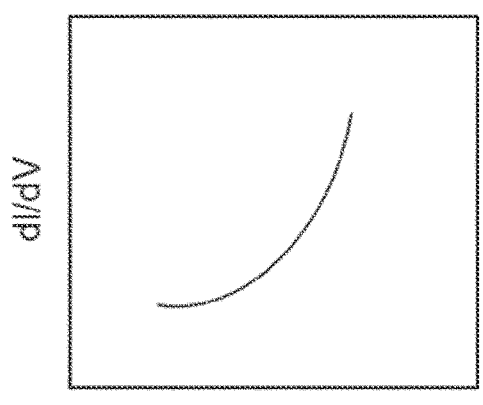
FIG. 12 is a graph representing another relationship between the voltage applied to the light-emitting element and the derivative of a supplied current with respect to the applied voltage.

FIG. 11 is a graph representing a relationship between the voltage applied to the light-emitting element 11 and the derivative of a supplied current with respect to the applied voltage. FIG. 12 is a graph representing another relationship between the voltage applied to the light-emitting element 11 and the derivative of a supplied current with respect to the applied voltage.

In the graph representing the voltage dependence of the first derivative value of a current value with respect to voltage, as shown in FIGS. 11 and 12, if there are monotonous increases with no peak value, no voltage value exists that satisfies the determination formula, "J(n−1)>J(n)." In addition, if the measured current value is zero, no voltage value exists that satisfies the determination formula, "J(n−1)>J(n)." In these cases, the inspection-target pixel of the inspection-target light-emitting element 11 is determined to not be emitting light (NO in step S14).

The peak determination circuit 440 calculates the first derivative value of a current value with respect to voltage and determines a peak voltage value, and if a peak voltage value is determined to exist, the peak determination circuit 440 evaluates that the light-emitting element 11 in the QLED is emitting light. If a peak voltage value is determined to not exist, the peak determination circuit 440 evaluates that the light-emitting element 11 not emitting light. The peak determination circuit 440 stores the result in the memory section. This enables inspection for each light-emitting element 11 in the QLED.

According to this configuration, the inspection can be performed for each light-emitting element 11 in the QLED independently of the pixel size of the display device.

In this manner, in Embodiment 1, by calculating the peak voltage value at which the luminance of the light-emitting element 11 has a peak from dI/dV and inspecting, for example, the luminance and dark spot of the light-emitting element from the peak voltage value, for example, an optical sensor is no longer required, and the light-on inspection of the light-emitting element 11 can be performed at a low cost. It is assumed that in the dI/dV plotted for the light-emitting element 11 incapable of emitting light and for the light-emitting element 11 with a defect such as a dark spot or a bright spot, the peak voltage value at which the luminance has a peak does not match the peak voltage value at which the dI/dV has a peak as shown in FIGS. 5 and 6.

This enables determination of the state of change of the light-emitting element 11 from the relationship between the voltage and current that flows in the light-emitting element 11 in the QLED.

A light-emitting element for current voltage monitoring may be provided for each RGB light-emitting element or on the screen.

Embodiment 2

Embodiment 2 differs from Embodiment 1 in the peak determination step (STEP 3-3) for the light-emitting element 11 based on the peak voltage value shown in FIG. 4 and in the processing step (STEP 3-4). Specifically, a difference from Embodiment 1 lies where the peak determination circuit 440 in the inspection circuit 400 determines whether the light-emitting element 11 in the subpixel that is an inspection target emits normal light, does not emit light, or emits abnormal light in the peak determination step (STEP 3-3) by making use of the peak voltage value (V0) obtained from a luminance-voltage curve acquired in advance for the light-emitting element 11 in the QLED that is an inspection target. Another difference from Embodiment 1 lies in relation to the processing step (STEP 3-4) whereby the processing circuit 450 processes the light-emitting element 11 on the basis of the aforementioned result.

Figures 13, 14:
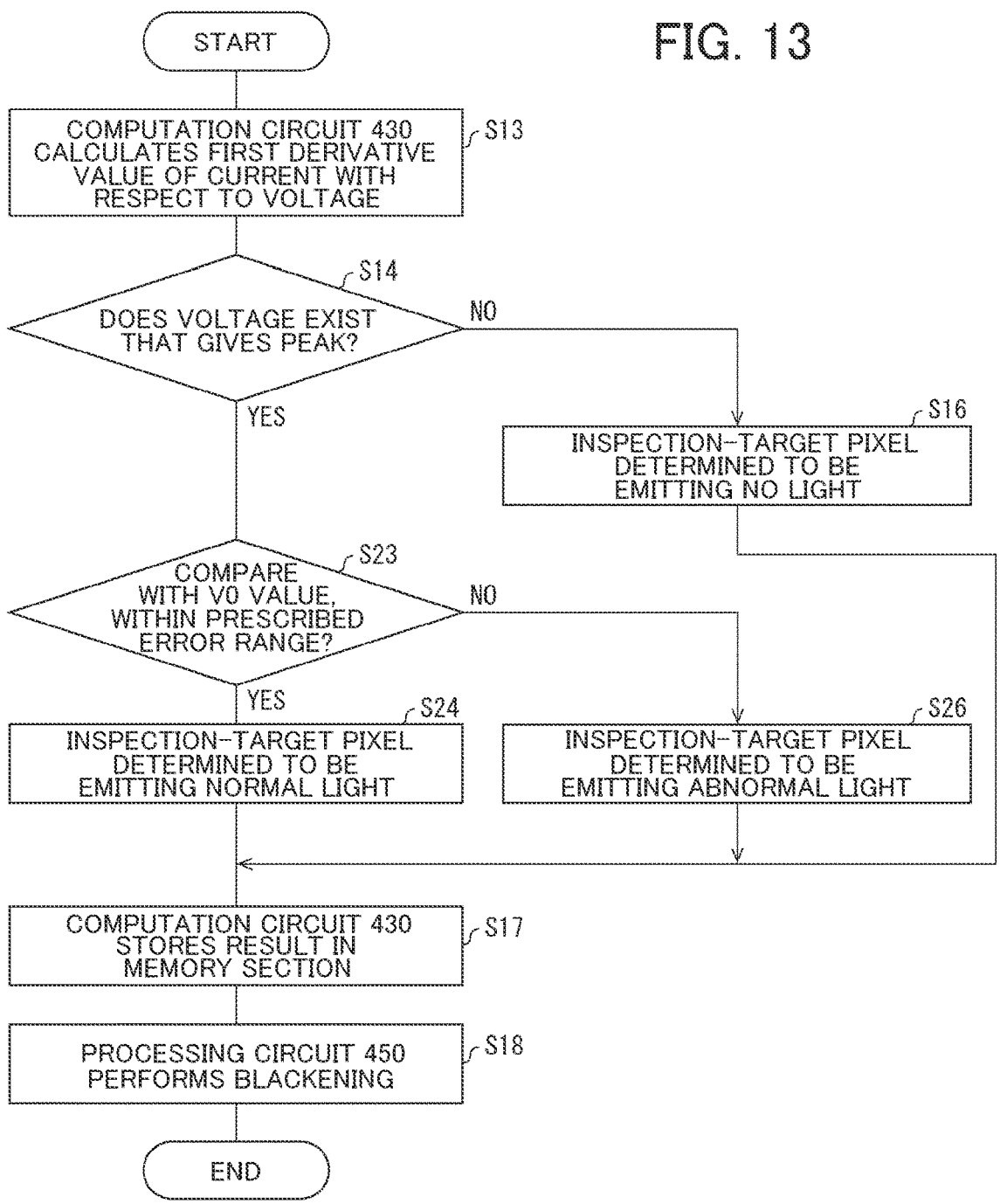
FIG. 13 is a flow chart representing a light-on inspection process for a light-emitting element 11 in accordance with Embodiment 2.
FIG. 14 is a diagram showing a method of blackening in a blackening step for a light-on inspection method for the light-emitting element.

FIG. 13 is a flow chart representing a light-on inspection step for the light-emitting element 11 in accordance with Embodiment 2. Members of the present embodiment that are similar to those described earlier are indicated by similar reference numerals, and description thereof is not repeated. As step S10 to step S13 are the same as in FIG. 7 in accordance with Embodiment 1, detailed description thereof is omitted in relation to FIG. 13. FIG. 13 shows in further detail the inspection step (STEP 3) in the flow chart representing the inspection step for the display device including the light-emitting element 11 shown in FIG. 3.

A description is given next of a basic operation in accordance with Embodiment 2. First, the drive transistor 202 is turned off (step S10). Then, the monitoring transistor 230 is turned on (step S11).

Next, the voltage supply circuit 410 applies voltage to the light-emitting element 11 while altering the voltage value. This applied voltage needs only to be in a voltage range from the voltage acquired in advance at which the light-emitting element 11 starts emitting light to a voltage at which a peak voltage can be recognized. This configuration enables a light-on inspection in a voltage range where the light-emitting element 11 stably emits light. Then, the measuring circuit 420 measures the current that flows in the light-emitting element 11 at that time and transmits the measured current value to the computation circuit 430 as necessary (step S12). The process so far is an equivalent of the measurement step (STEP 3-1) in FIG. 4.

Thereafter, the computation circuit 430 calculates the first derivative value of the measured current value with respect to voltage (step S13). This is an equivalent of the computation step (STEP 3-2) in FIG. 4.

Then, the peak determination circuit 440 determines the presence/absence of a voltage value at which the first derivative value of current with respect to voltage has a peak (step S14). This is an equivalent of the peak determination step (STEP 3-3) in FIG. 4 whereby the peak voltage value of the peak of the first derivative value is determined.

In this peak determination step, if the peak determination circuit 440 determines that there exists a voltage value at which the first derivative value with respect to voltage has a peak (YES in step S14), the peak determination circuit 440 compares the voltage value at which the first derivative value has a peak and the peak voltage value (V0) (reference value) obtained from a luminance-voltage curve acquired in advance for the light-emitting element 11 that is an inspection target to determine whether or not the difference is in a prescribed variation range (step S23).

If the peak determination circuit 440 determines that there exists no voltage value at which the first derivative value with respect to voltage has a peak (NO in step S14), the peak determination circuit 440 evaluates that the light-emitting element 11 in the subpixel that is an inspection target is not emitting light (non-light-emitting element) (step S16) and records the result of the inspection in the memory section (step S17).

The peak determination circuit 440, upon determining that the difference is in a prescribed variation range by comparing the voltage value at which the first derivative value of current with respect to voltage has a peak and the peak voltage value (V0) obtained from a luminance-voltage curve acquired in advance (YES in step S23), evaluates that the light-emitting element 11 in the subpixel that is a measurement target is emitting normal light (normal light-emitting element) (step S24) and records the result of the inspection in the memory section (step S17). Then, the peak determination circuit 440, if the difference is out of a prescribed variation range as a result of comparison of the voltage value at which the first derivative value of current with respect to voltage has a peak and the peak voltage (V0) obtained from a luminance-voltage curve acquired in advance (NO in step S23), evaluates that the light-emitting element 11 in the subpixel that is a measurement target is emitting abnormal light (abnormal light-emitting element) (step S26) and records as an abnormal light-emitting point in the memory (step S17). Abnormal light emission is an equivalent of a condition where the element has decayed in comparison with the condition before shipping, for example, a condition where light is being emitted under the application of a prescribed voltage, but with an extremely low or high luminance relative the luminance tolerable in advance as variations.

The processing circuit 450 performs the following process on the light-emitting element 11 determined to be a non-light-emitting element in step S14 by the inspection circuit 400, the light-emitting element 11 determined to be an abnormal light-emitting element in step S23, and the pixel including these light-emitting elements. This is an equivalent of the processing step (STEP 3-4) for the light-emitting element in FIG. 4. If there is a non-light-emitting element or an abnormal light-emitting element in a pixel, the pixel loses the color balance. This disadvantageously lowers quality. The processing circuit 450 performs a blackening process of assigning a data signal (zero data signal) that inherently represents a black display to a pixel including such a non-light-emitting element or abnormal light-emitting element.

Blackening is to assign a data signal (zero data signal) that inherently represents a black display to a pixel including such a non-light-emitting element or abnormal light-emitting element.

Figures 15, 16:
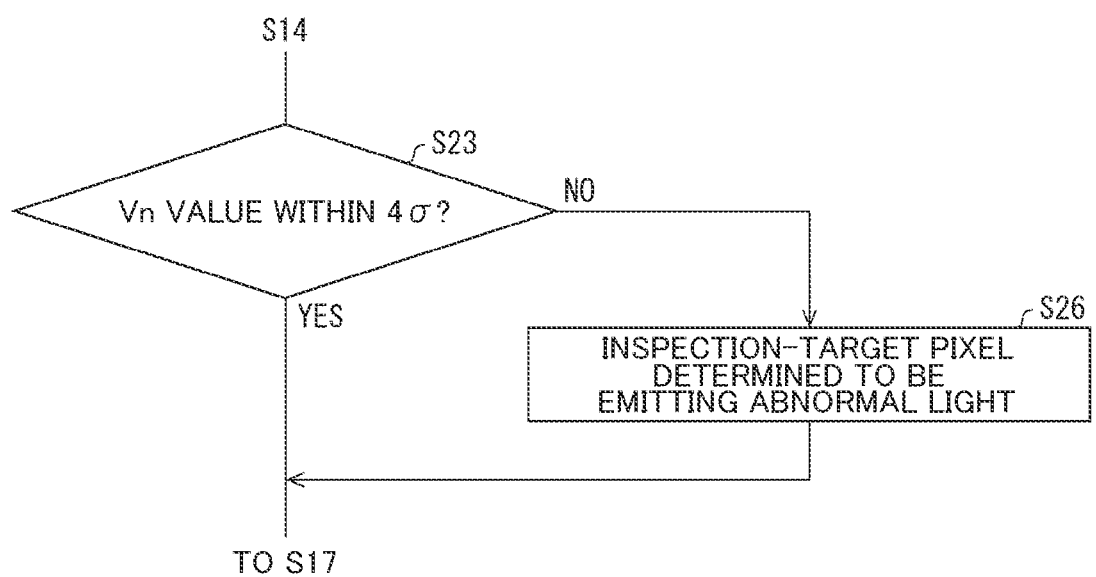
FIG. 15 is a diagram showing a method of blackening in a blackening step for a light-on inspection method for the light-emitting element.
FIG. 16 is a diagram showing details of the flow chart.

FIGS. 14 and 15 are diagrams showing a method of blackening in a blackening step for a light-on inspection method for the light-emitting element 11. In the example shown in FIG. 14, as shown in FIG. 15, an example is shown where if there is a light-emitting element 11 for red light (R) determined to be an abnormal light-emitting element, a zero data signal is inputted to the light-emitting elements 11 for green (G) and blue (B), which are the other colors. The light-emitting element 11 determined to be a non-light-emitting element can also be blackened similarly to Embodiment 1. This enables maintaining quality in a more satisfactory manner.

FIG. 16 is a diagram showing details of the flow chart. In this example, details of step S23 will be described. A difference from Embodiment 1 lies where step S23 is added after step S14.

The peak determination circuit 440, if the difference is in a prescribed variation range as a result of comparison of the voltage at which the first derivative value of current with respect to voltage has a peak and the peak voltage (V0) obtained from a luminance-voltage curve acquired in advance (YES in step S23), evaluates that the light-emitting element 11 in the subpixel that is a decay measurement target is emitting normal light (normal light-emitting element) (step S24) and records the result of the inspection in the memory section (step S17). The peak determination circuit 440, upon determining that the difference is out of the prescribed variation range as a result of comparison of the voltage at which the first derivative value of current with respect to voltage has a peak and the peak voltage (V0) obtained from a luminance-voltage curve acquired in advance (NO in step S23), evaluates that the light-emitting element 11 in the subpixel that is a decay measurement target is emitting abnormal light (step S26) and records as an abnormal light-emitting element (decay) in the memory (step S17). This variation range may be set on the basis of, for example, the luminescence properties of the light-emitting element 11 in the QLED. For instance, if it is possible to approximate the variations of the peak voltage (V0) obtained from a luminance-voltage curve acquired in advance by a normal distribution, it is preferred that 4σ be used where σ is a standard deviation. Specifically, letting the peak voltage (V0) be equal to the reference value and the voltage at which the first derivative value of current with respect to voltage has a peak (local maximum) be equal to a peak voltage value, the light-emitting element 11 can be determined to be a normal light-emitting element if the difference thereof is in a prescribed range (e.g., 4σ where the standard deviation is equal to σ) and to be an abnormal light-emitting element if the difference is out of the range.

By this inspection (step S14), it is determined Whether or not the value Vn of the acquired peak voltage is within the standard deviation (step S23). If the value Vn of the acquired peak voltage is within the standard deviation (YES in step S23), the light-emitting element 11 in the subpixel that is an inspection target is determined to be emitting normal light (step S24). In addition, if the value Vn of the acquire peak voltage is outside the standard deviation (NO in step S23), the light-emitting element 11 in the subpixel that is a decay measurement target is determined to be an abnormal light-emitting element (step S26). This abnormal light emission is, as an example, a condition where light is being emitted under the application of a voltage, but with an extremely low or high luminance.

In Embodiment 2, the inspection circuit 400 can detect an abnormal light-emitting point by comparing the peak voltage value obtained by the inspection and the peak voltage (V0) obtained from a luminance-voltage curve acquired in advance for the light-emitting element 11 that is an inspection target. Therefore, the inspection can be more accurately performed than in Embodiment 1. Additionally, it becomes possible to determine normal luminance condition and changing condition (decay) of the luminance condition.

According to the aforementioned configuration, the inspection can be performed for each light-emitting element 11 in the QLED independently of the pixel size.

Variation Examples

If the pixels in the display device include red light-emitting elements that emit red light, green light-emitting elements that emit green light, and blue light-emitting elements that emit blue light and are arranged in stripes, the voltage supply circuit 410 may apply a voltage to the red light-emitting elements, the green light-emitting elements, and the blue light-emitting elements, and the measuring circuit 420 may simultaneously measure the current values that flow in response to the voltages.

This enables completing the measurement step in a shorter time, thereby reducing takt time, in comparison with when the measurement step is performed on one light-emitting element 11 at a time.

The disclosure, in an aspect thereof, enables light-on inspection of the light-emitting elements 11 in downsized pixels at a low cost.

By the pixels in the display device 1 including red light-emitting elements that emit red light, green light-emitting elements that emit green light, and blue light-emitting elements that emit blue light and by providing the processing circuit 450 (blackening circuit) for blackening the light-emitting elements of the other colors in the same pixel as the pixels including the non-light-emitting elements, the quality of the display device can be maintained in a more satisfactory manner.

By the pixels in the display device 1 including red light-emitting elements that emit red light, green light-emitting elements that emit green light, and blue light-emitting elements that emit blue light and being arranged in stripes and by the inspection circuit 400 including the measuring circuit 420 for simultaneously measuring the current values that flow in the red light-emitting elements, the green light-emitting elements, and the blue light-emitting elements respectively, the quality of the display device 1 can be maintained in a more satisfactory manner, the time taken by the inspection can be shortened, and the takt time can be reduced.

The present invention is not limited to the description of the embodiments above and may be altered within the scope of the claims. Embodiments based on a proper combination of technical means disclosed in different embodiments are encompassed in the technical scope of the present invention. Furthermore, new technological features can be created by combining different technical means disclosed in the embodiments.

The invention claimed is:

1. A display device including a plurality of pixels each including at least one light-emitting element, the display device including
    an inspection circuit configured to inspect a luminance condition of the at least one light-emitting element, the inspection circuit comprising:
        a voltage sweep circuit configured to sweep a voltage to the at least one light-emitting element;
        a measuring circuit configured to sweep a voltage to the at least one light-emitting element and to measure a current value that flows in the at least one light-emitting element in response to a voltage value applied;
        a computation circuit configured to compute a first derivative value of the current value with respect to the voltage value, the first derivative value representing voltage dependence of a first derivative of the current value;
        a peak determination circuit configured to determine whether the first derivative value has a local maximum value; and
        a processing circuit configured to blacken the at least one light-emitting element based on a result of the determination made by the peak determination circuit.

2. The display device according to claim 1, wherein the peak determination circuit is further configured to determine that the at least one light-emitting element is a light-emission-capable element when the first derivative value has the local maximum value and that the at least one light-emitting element is a non-light-emitting element when the first derivative value does not have the local maximum value.

3. The display device according to claim 2, wherein
    the plurality of pixels each includes a plurality of light-emitting elements including the at least one light-emitting element, and
    the processing circuit is further configured to blacken the at least one light-emitting element in one of the plurality of pixels including the non-light-emitting element.

4. The display device according to claim 3, wherein the plurality of pixels includes red light-emitting elements that emit red light, green light-emitting elements that emit green light, and blue light-emitting elements that emit blue light.

5. The display device according to claim 1, wherein the peak determination circuit is further configured to:
    calculate a difference between a reference value and a peak voltage value at which the first derivative value has the local maximum value, determine that the at least one light-emitting element is a normal light-emitting element when the difference is in a prescribed range, and determine that the at least one light-emitting element is an abnormal light-emitting element when the difference is out of the prescribed range.

6. The display device according to claim 5, wherein
the plurality of pixels each includes a plurality of light-emitting elements including the at least one light-emitting element, and
the processing circuit is further configured to blacken the at least one light-emitting element in one of the plurality of pixels including the abnormal light-emitting element.

7. The display device according to claim 1, wherein the peak determination circuit is further configured to:
when the first derivative value does not have the local maximum value, determine that the at least one light-emitting element is a non-light-emitting element, and
when the first derivative value has the local maximum value,
calculate a difference between a reference value and a peak voltage value at which the first derivative value has the local maximum value,
determine that the at least one light-emitting element is a normal light-emitting element when the difference is in a prescribed range, and
determine that the at least one light-emitting element is an abnormal light-emitting element when the difference is out of the prescribed range.

8. The display device according to claim 7, wherein
the plurality of pixels each includes a plurality of light-emitting elements including the at least one light-emitting element, and
the processing circuit is further configured to blacken the at least one light-emitting element in one of the plurality of pixels including the non-light-emitting element or the abnormal light-emitting element.

9. A method of driving a display device, the method including inspecting a luminance condition of a light-emitting element, the inspecting comprising:
sweeping a voltage to the light-emitting element and measuring a current value that flows in the light-emitting element in response to a voltage value applied;
computing a first derivative value of the current value with respect to the voltage value, the first derivative value representing voltage dependence of a first derivative of the current value;
determining whether the first derivative value has a local maximum value; and
blackening the light-emitting element based on a result of a determination.

* * * * *